United States Patent
Kono (10) Patent No.: US 8,306,072 B2
(45) Date of Patent: Nov. 6, 2012

(54) SEMICONDUCTOR LASER DEVICE

(75) Inventor: Naoya Kono, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/178,080

(22) Filed: Jul. 7, 2011

(65) Prior Publication Data

US 2012/0020377 A1 Jan. 26, 2012

(30) Foreign Application Priority Data

Jul. 20, 2010 (JP) ................... 2010-163023

(51) Int. Cl.
*H01S 3/30* (2006.01)
(52) U.S. Cl. .......................................... 372/6
(58) Field of Classification Search .............. 372/6
See application file for complete search history.

(56) References Cited

U.S. PATENT DOCUMENTS

| 2005/0052724 A1* | 3/2005 | Suzuki et al. ............. 359/305 |
| 2007/0170441 A1* | 7/2007 | Takizawa et al. ............. 257/79 |

FOREIGN PATENT DOCUMENTS

JP 7-249829 9/1995

* cited by examiner

*Primary Examiner* — Patrick Stafford
(74) *Attorney, Agent, or Firm* — Smith, Gambrell & Russell, LLP (57) ABSTRACT

A semiconductor laser device includes a lower cladding layer; an active layer disposed on the lower cladding layer; an upper cladding layer disposed on the active layer; a diffraction-grating layer disposed on the upper cladding layer, the diffraction-grating layer including periodic projections and recesses; and a buried layer disposed on the periodic projections and recesses in the diffraction-grating layer. In addition, the diffraction-grating layer and the buried layer constitute a diffraction grating. The lower cladding layer, the active layer, and the upper cladding layer constitute a first optical waveguide, the active layer constituting a first core region in the first optical waveguide. The upper cladding layer, the diffraction-grating layer, and the buried layer constitute a second optical waveguide, the diffraction-grating layer constituting a second core region in the second optical waveguide. Furthermore, the first optical waveguide and the second optical waveguide are optically coupled through the upper cladding layer.

9 Claims, 5 Drawing Sheets

SEMICONDUCTOR LASER DEVICE

BACKGROUND OF THE INVENTION

1. Field of the Invention

The present invention relates to a semiconductor laser device.

2. Description of the Related Art

Patent Document 1 (Japanese Unexamined Patent Application Publication No. 7-249829) describes a distributed feedback laser (DFB laser) formed on a semiconductor substrate. This DFB laser includes a p-type InP cladding layer, an optical guide layer, an active layer having a strained quantum well structure, and an n-type InP cladding layer. These layers are stacked on a p-type InP substrate in this order. A diffraction grating is formed at the interface between the p-type InP cladding layer and the optical guide layer. The p-type InP cladding layer and the n-type InP cladding layer have smaller refractive indices than the optical guide layer and the active layer. Specifically, the DFB laser has a single optical-waveguide structure constituted by the p-type InP cladding layer, the optical guide layer, the active layer, and the n-type InP cladding layer. In the optical-waveguide structure, the optical guide layer and the active layer are sandwiched between the p-type InP cladding layer and the n-type InP cladding layer. Therefore, the optical guide layer and the active layer are core region of the optical waveguide. Light generated in the active layer is confined within the optical guide layer and the active layer.

SUMMARY OF THE INVENTION

A conventional DFB laser having the structure described in Patent Document 1 has the following problems. By applying a modulated current to such a DFB laser, optical signals modulated in accordance with the modulated signals are output. The refractive indices of the active layer and the optical guide layer of a DFB laser is changed by a current injecting into the active layer and the optical guide layer. Since a diffraction grating is formed at the interface between the p-type InP cladding layer and the optical guide layer. Therefore, the reflection wavelength of the diffraction grating changes in accordance with change in the effective refractive index of the optical guide layer. The lasing wavelength of the DFB laser changes at high frequency modulation, which is called wavelength chirping. The wavelength chirping limits transmission distance and transmission speed in optical communications systems. Specifically, the application of a conventional DFB laser is limited to light sources for optical communications over a relatively short distance and at a relatively low transmission speed.

A semiconductor laser device according to an embodiment of the present invention includes a lower cladding layer; an active layer disposed on the lower cladding layer; an upper cladding layer disposed on the active layer; a diffraction-grating layer disposed on the upper cladding layer, the diffraction-grating layer including periodic projections and recesses; and a buried layer disposed on the periodic projections and recesses in the diffraction-grating layer. In addition, the diffraction-grating layer and the buried layer constitute a diffraction grating. The lower cladding layer, the active layer, and the upper cladding layer constitute a first optical waveguide, the active layer constituting a first core region in the first optical waveguide. The upper cladding layer, the diffraction-grating layer, and the buried layer constitute a second optical waveguide, the diffraction-grating layer constituting a second core region in the second optical waveguide. Furthermore, the first optical waveguide and the second optical waveguide are optically coupled through the upper cladding layer.

The semiconductor laser device according to the embodiment includes the first optical waveguide constituted by the lower cladding layer, the active layer, and the upper cladding layer; and the second optical waveguide constituted by the upper cladding layer, the diffraction-grating layer, and the buried layer. The active layer constitutes a first core region in the first optical waveguide. The diffraction-grating layer constitutes a second core region in the second optical waveguide. The first optical waveguide and the second optical waveguide are optically coupled with each other through the upper cladding layer. The diffraction-grating layer includes periodic projections and recesses arranged in the light propagation direction. The buried layer is disposed on the periodic projections and recesses in the diffraction-grating layer. In the semiconductor laser device according to the embodiment, light generated in the active layer propagates through the first optical waveguide. That is, this optical guided mode (hereafter, referred to as an active-layer mode) propagates through the first optical waveguide including the active layer as the first core region. In addition to this active-layer mode, another optical guided mode (hereafter, referred to as a diffraction-grating-layer mode) propagates through the second optical waveguide including the diffraction-grating layer as the second core region. The dispersion curve of the active-layer mode is different from that of the diffraction-grating-layer mode. The active-layer mode and the diffraction-grating-layer mode being in proximity to each other propagate in the first optical waveguide and the second optical waveguide, respectively. A phase matching condition for lasing is satisfied at a wavelength at which the dispersion curve of the active-layer mode and the dispersion curve of the diffraction-grating-layer mode intersect. Lasing occurs at this specific wavelength (single wavelength) at which the phase matching condition is satisfied. The wavelength of light propagating at the diffraction-grating-layer mode depends on the period of the diffraction grating. The active layer (the first core region) of the first optical waveguide and the diffraction-grating layer (the second core region) of the second optical waveguide are spatially separated from each other through the upper cladding layer therebetween. When a current is injected into the active layer, the refractive index of the active layer changes. Then, the dispersion curve of the active-layer mode propagating through the first optical waveguide changes. However, even when a current is injected into the active layer, the refractive index of the diffraction-grating layer almost does not change because a current is not injected into the diffraction-grating layer. As a result, the dispersion curve of the diffraction-grating-layer mode propagating through the second optical waveguide almost does not change. Furthermore, the wavelength of light at the point where the dispersion curves of the first and second optical waveguides intersect almost does not change. Therefore, in the semiconductor laser device according to the embodiment, even when a modulated current is injected into the active layer, variation in the lasing wavelength can be reduced and wavelength chirping can be suppressed.

The semiconductor laser device according to the embodiment may further include a lower optical confinement layer disposed between the lower cladding layer and the active layer; and an upper optical confinement layer disposed between the active layer and the upper cladding layer. In addition, the lower optical confinement layer, the active layer, and the upper optical confinement layer may constitute the first core region in the first optical waveguide.

In the semiconductor laser device according to the embodiment, the buried layer may be composed of a dielectric material. Dielectric materials have a refractive index considerably lower than the refractive index of semiconductors. Accordingly, by forming the buried layer with a dielectric material, the refractive index difference between the buried layer and the diffraction-grating layer can be increased. As a result, the diffraction-grating-layer mode propagating through the second optical waveguide is strongly coupled to the diffraction grating. The coupling coefficient κ between the diffraction-grating-layer mode and the diffraction grating is increased. By increasing the coupling coefficient κ between the diffraction-grating-layer mode and the diffraction grating, variation in the wavelength of the dispersion curve of the diffraction-grating-layer mode can be reduced with respect to variation in the propagation constant. As a result, the influence of variation in the refractive index of the active layer on the lasing wavelength can be further reduced. Therefore, in the semiconductor laser device, wavelength chirping can be further suppressed. The dielectric material may contain at least one of $SiO_2$, SiN, $Al_2O_3$, and TiO.

In the semiconductor laser device according to the embodiment, the buried layer may be composed of a polyimide resin or a benzocyclobutene resin.

In the semiconductor laser device according to the embodiment, a relative refractive index difference (n1−n0)/n1 may be 0.15 or more where n1 represents a refractive index of the diffraction-grating layer and n0 represents a refractive index of the buried layer. When the relative refractive index difference between the diffraction-grating layer and the buried layer is 0.15 or more, the coupling coefficient κ between the diffraction-grating-layer mode and the diffraction grating is sufficiently increased and the influence of variation in the refractive index of the active layer on the lasing wavelength can be effectively reduced. Therefore, in the semiconductor laser device, wavelength chirping can be further effectively suppressed.

In the semiconductor laser device according to the embodiment, the upper cladding layer may have a thickness of 500 nm or more and 1500 nm or less. The thickness of the upper cladding layer relates to the distance between the first core region (the active layer) of the first optical waveguide and the second core region (the diffraction-grating-layer) of the second optical waveguide. By forming the upper cladding layer so as to have a thickness of 500 nm or more, the active-layer mode propagating through the first optical waveguide and the diffraction-grating-layer mode propagating through the second optical waveguide can be readily formed. By optically coupling the first optical waveguide and the second optical waveguide, the active-layer mode and the diffraction-grating-layer mode interact with each other to achieve lasing. When the thickness of the upper cladding layer is more than 1500 nm, the optical coupling between the first optical waveguide and the second optical waveguide becomes weak and hence it becomes difficult to achieve lasing with the active-layer mode and the diffraction-grating-layer mode interacting with each other.

In the semiconductor laser device according to the embodiment, the diffraction-grating layer may have a thickness of 200 nm or more. By forming the diffraction-grating layer so as to have such a large thickness, the diffraction-grating-layer mode can be suitably formed. For the diffraction-grating layer having such a large thickness, the periodic projections and recesses formed in the diffraction-grating layer can have a large height or large depth. The buried layer is disposed on the periodic projections and recesses. Furthermore, the buried layer has the refractive index remarkably smaller than that of the diffraction-grating layer. In this case, the coupling coefficient κ between the diffraction-grating-layer mode and the diffraction grating can be sufficiently increased. Therefore, the influence of variation in the refractive index of the active layer on the lasing wavelength can be effectively reduced. Therefore, in the semiconductor laser device, wavelength chirping can be further effectively suppressed.

In the semiconductor laser device according to the embodiment, the diffraction grating is preferably constituted by arranging the diffraction-grating layer and the buried layer alternately in a light propagation direction.

The semiconductor laser device according to the embodiment may further include a mesa structure including the first optical waveguide and the second optical waveguide, the mesa structure having a pair of lateral surfaces facing each other; a first semiconductor buried layer of a first conductivity type; and a second semiconductor buried layer of a second conductivity type. In addition, the first semiconductor buried layer is disposed on one of the lateral surfaces of the mesa structure. The second semiconductor buried layer is disposed on another one of the lateral surfaces of the mesa structure. Furthermore, the mesa structure is buried with the first and second semiconductor buried layers. In addition, the semiconductor laser device according to the embodiment may further include an electrode disposed on the first semiconductor buried layer; and another electrode disposed on the second semiconductor buried layer.

In the semiconductor laser device according to the embodiment, a mesa structure including the first optical waveguide and the second optical waveguide is formed on the substrate. Furthermore, the mesa structure is buried with the first and second semiconductor buried layers. The first and second semiconductor buried layers have lower refractive indices than those of the active layer and the diffraction-grating layer. Therefore, the active-layer mode propagating through the first optical waveguide and the diffraction-grating-layer mode propagating through the second optical waveguide can be confined in mesa structure. Furthermore, by forming the mesa structure, the transverse mode in the semiconductor laser device can be controlled. In addition, by forming the first and second semiconductor buried layers of different conductivity types on the lateral surfaces of the mesa structure, a current can be injected into the active layer through the first and second semiconductor buried layers. The semiconductor laser device according to the embodiment may further include an electrode disposed on the first semiconductor buried layer; and another electrode disposed on the second semiconductor buried layer.

DESCRIPTION OF THE PREFERRED EMBODIMENTS

Hereinafter, a semiconductor laser device according to an embodiment of the present invention will be described in detail with reference to the attached drawings. In the description of the drawings, like reference numerals denote like elements and redundant descriptions are omitted.

First Embodiment

Figure 1:
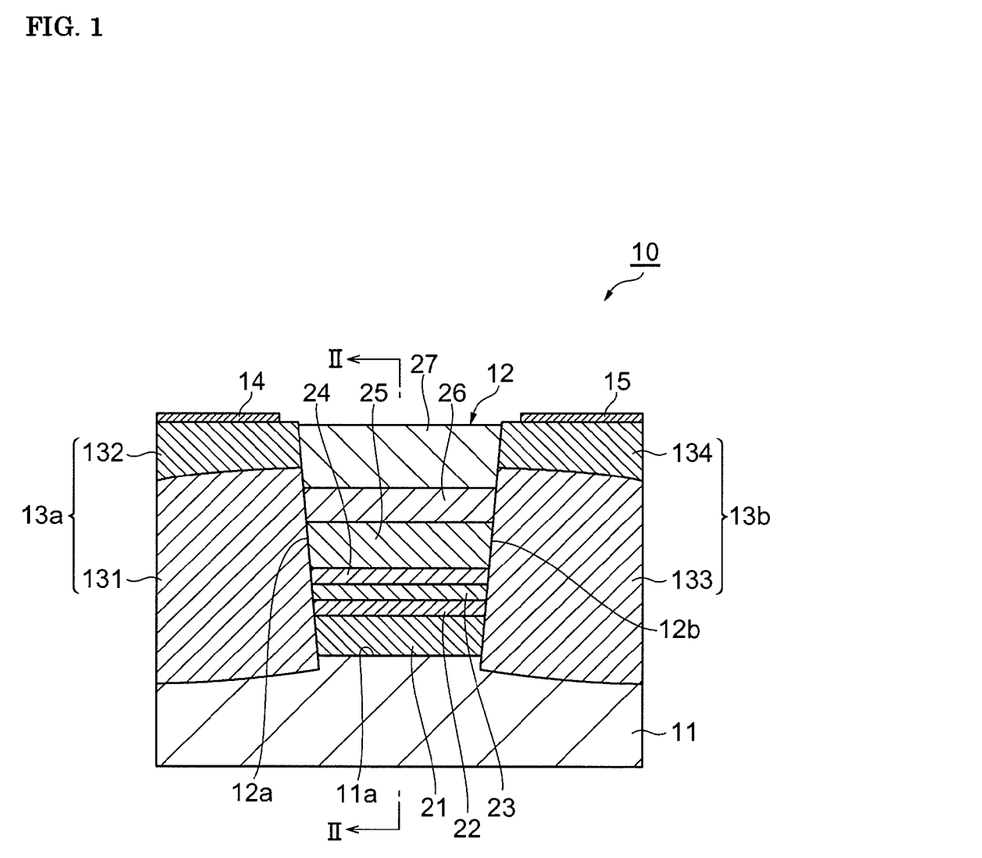
FIG. 1 is a sectional view illustrating the structure of a semiconductor laser device according to an embodiment.
Figure 2:
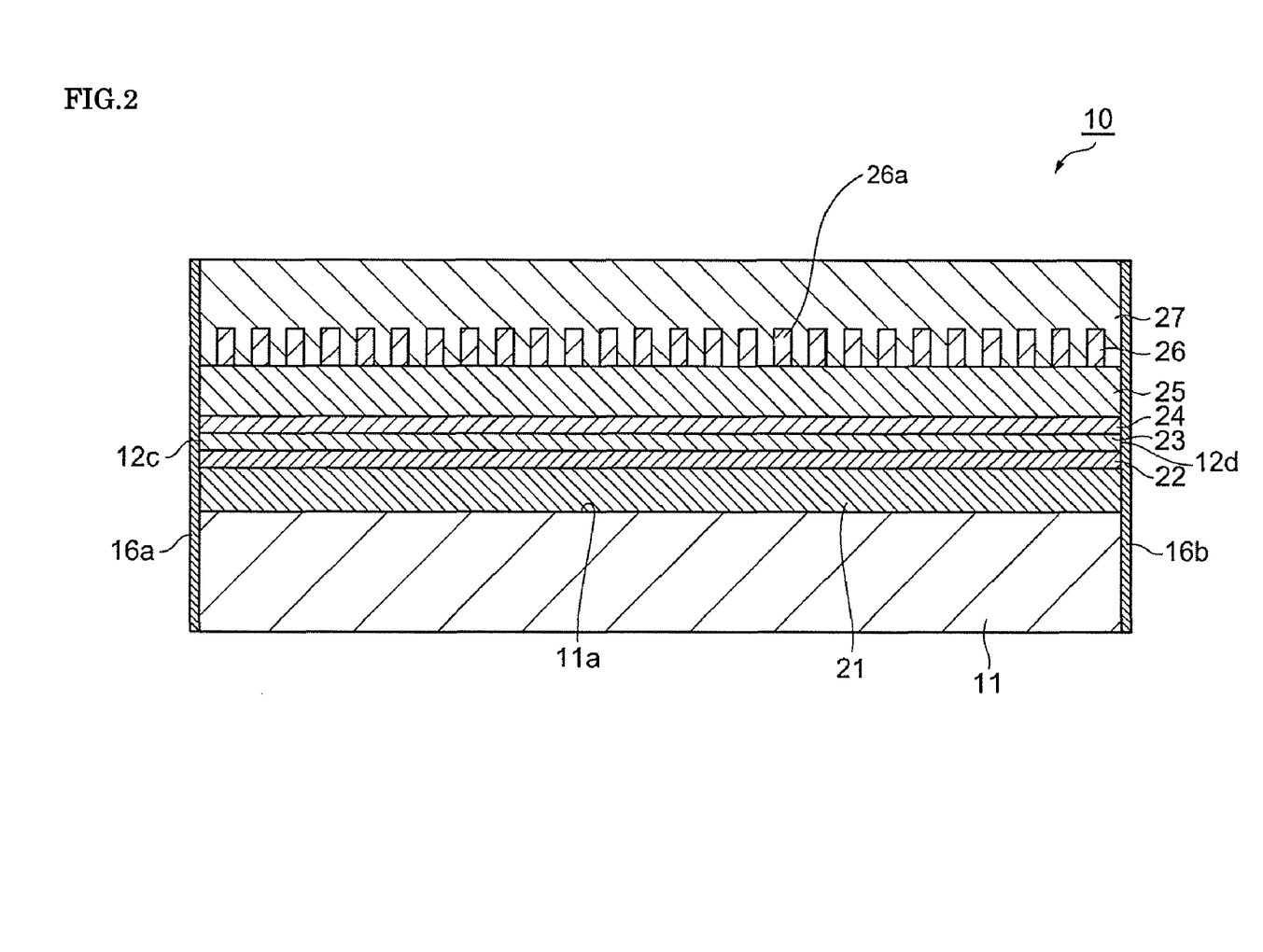
FIG. 2 illustrates a section taken along line II-II of FIG. 1.

FIG. 1 is a sectional view illustrating the structure of a semiconductor laser device 10 according to an embodiment of the present invention. The section illustrated in FIG. 1 is perpendicular to the light propagation direction of the semiconductor laser device 10. FIG. 2 illustrates a section taken along line II-II of FIG. 1. The semiconductor laser device 10 includes a substrate 11, a mesa part 12, buried parts 13a and 13b, an anode electrode 15, and a cathode electrode 14. The mesa part 12 is disposed on the substrate 11. The buried parts 13a and 13b are disposed on the substrate 11 and on the lateral surfaces of the mesa part 12. The mesa part 12 is buried with the buried parts 13a and 13b.

The substrate 11 has a main surface 11a. In the first embodiment, a III-V group compound semiconductor such as InP is epitaxially grown on the main surface 11a. The substrate 11 is preferably composed of a semi-insulating semiconductor. For example, the substrate 11 is made of Fe-doped InP.

The mesa part 12 has a stripe shape and extends in the light propagation direction of the semiconductor laser device 10. The mesa part 12 has a pair of lateral surfaces 12a and 12b that extend in the light propagation direction. The mesa part 12 is disposed on the main surface 11a of the substrate 11. The mesa part 12 includes a lower cladding layer 21, a lower optical confinement layer 22, an active layer 23, an upper optical confinement layer 24, an upper cladding layer 25, a diffraction-grating layer 26, and a buried layer 27. The lower cladding layer 21, the lower optical confinement layer 22, the active layer 23, the upper optical confinement layer 24, and the upper cladding layer 25 constitute a first optical waveguide. The lower optical confinement layer 22, the active layer 23, the upper optical confinement layer 24 are sandwiched between the lower cladding layer 21 and the upper cladding layer 25. Therefore, The lower optical confinement layer 22, the active layer 23, the upper optical confinement layer 24 constitute a core region of the first optical waveguide. The lower optical confinement layer 22, the active layer 23, the upper optical confinement layer 24 is a first core region of the first optical waveguide in the embodiment. The upper cladding layer 25, the diffraction-grating layer 26, and the buried layer 27 constitute a second optical waveguide. The diffraction-grating layer 26 sandwiched between the upper cladding layer 25 and the buried layer 27 constitutes a core region of the second optical waveguide. The diffraction-grating layer 26 is a second core region of the first optical waveguide in the embodiment. The first optical waveguide and the second optical waveguide are optically coupled with each other through the upper cladding layer 25.

Referring to FIG. 2, antireflection coatings (AR coatings) 16a and 16b are disposed on end facets 12c and 12d of the mesa part 12 in the light propagation direction. The first optical waveguide and the second waveguide are disposed between the end facet 12c and the end facet 12d. The distance between the end facets 12c and 12d (laser cavity length) is, for example, 250 µm.

The lower cladding layer 21 is a III-V group compound semiconductor layer having a higher band gap energy than the lower optical confinement layer 22 and the active layer 23, such as an undoped InP layer. The lower cladding layer 21 has a lower refractive index than the lower optical confinement layer 22 and the active layer 23. The lower cladding layer 21 has a thickness of for example, 1.5 µm.

The lower optical confinement layer 22 is disposed on the lower cladding layer 21. The lower optical confinement layer 22 is a III-V group compound semiconductor layer such as an undoped InGaAsP layer. The lower optical confinement layer 22 has a thickness of for example, 150 nm. The lower optical confinement layer 22 has a band gap wavelength of, for example, 1.15 µm. The band gap energy Eg (eV) and the band gap wavelength $\lambda g$ (µm) satisfy the following relationship: $Eg=1.24/\lambda g$.

The active layer 23 is a III-V group compound semiconductor layer and disposed on the lower optical confinement layer 22. The active layer 23 preferably has a multi-quantum well (MQW) structure in which quantum well layers and barrier layers are alternately stacked. Each of the quantum well layers and each of the barrier layers in the MQW structure are, for example, undoped InGaAsP layers having different compositions. Each quantum well layer has a thickness of for example, 5 nm. Each barrier layer has a thickness of, for example, 8 nm. The semiconductor layers constituting the barrier layers have a higher band gap energy than the semiconductor layers constituting the quantum well layers. The semiconductor layers constituting the quantum well layers have a band gap wavelength of, for example, 1.65 µm. The semiconductor layers constituting the barrier layers have a band gap wavelength of, for example, 1.2 µm. The active layer 23 has a light-emission wavelength of, for example, 1.55 µm. The quantum well layers have compressive strain (for example, 0.8% compressive strain). For example, the active layer 23 includes seven quantum well layers and eight barrier layers.

The upper optical confinement layer 24 is disposed on the active layer 23. The upper optical confinement layer 24 is a III-V group compound semiconductor layer such as an undoped InGaAsP layer. The upper optical confinement layer 24 has a thickness of, for example, 150 nm. The upper optical confinement layer 24 has a band gap wavelength of, for example, 1.15 µm.

The upper cladding layer 25 is disposed between the active layer 23 and the diffraction-grating layer 26 and, in the first embodiment, disposed on the upper optical confinement layer 24. The upper cladding layer 25 is a III-V group compound semiconductor layer having a higher band gap energy than the upper optical confinement layer 24 and the active layer 23, such as an undoped InP layer. The upper cladding layer 25 has a lower refractive index than the upper optical confinement layer 24 and the active layer 23. The upper cladding layer 25 preferably has a thickness of 0.5 µm or more, for example, 0.8 µm.

The diffraction-grating layer 26 is disposed on the upper cladding layer 25. In a conventional DFB semiconductor laser device, the diffraction-grating layer including a diffraction grating is disposed directly on the upper optical confinement layer to obtain a large optical coupling between a light generated from an active layer and the diffraction grating. In contrast, in the first embodiment, the diffraction-grating layer 26 is disposed on the upper cladding layer 25. Accordingly, the semiconductor laser device 10 according to the first embodiment has a large distance between the diffraction-grating layer 26 and the active layer 23.

The diffraction-grating layer 26 has periodic projections and recesses. A diffraction grating 26a is constituted by the diffraction-grating layer 26 and the buried layer 27 disposed on the periodic projections and recesses in diffraction-grating layer 26. The diffraction-grating layer 26 is composed of a III-V group compound semiconductor. The buried layer 27 is composed of, for example, a dielectric material. The projections and recesses formed in the diffraction-grating layer 26 are periodically arranged in the light propagation direction. The diffraction-grating layer 26 has a refractive index that is different from the refractive index of the buried layer 27. Thus, the diffraction grating 26a has a periodic structure in which a refractive index periodically changes in the light propagation direction. The light-emission wavelength of the semiconductor laser device 10 depends on the period of the diffraction grating 26a. Referring to FIG. 2, the diffraction grating 26a is formed in the following manner. A III-V group compound semiconductor layer to serve as the diffraction-grating layer 26 is formed on the upper cladding layer 25. This semiconductor layer is then etched through a mask having a pattern corresponding to the diffraction grating 26a. In this etching, in the first embodiment, the diffraction-grating layer 26 is etched to reach the upper cladding layer 25. As a result, the diffraction-grating layer 26 is divided in accordance with the period. The buried layer 27, for example, a dielectric layer, is then formed on the diffraction-grating layer 26 so as to fill the gaps in the diffraction-grating layer 26. Thus, the diffraction grating 26a is formed. The structure of a diffraction grating is not restricted to the structure in the first embodiment. For example, by terminating the etching of the diffraction-grating layer 26 at the midpoint in the thickness of the diffraction-grating layer 26, a diffraction grating may be formed that has periodic projections and recesses in the top surface (that is, a surface of the diffraction-grating layer 26, the surface being opposite another surface of the diffraction-grating layer 26 facing the active layer 23) of the diffraction-grating layer 26. The diffraction grating 26a has a period of, for example, 0.24 µm; and has a duty ratio (a ratio of width of the diffraction-grating layer 26 to period) of, for example, 0.71. The period of the diffraction grating 26a is made such that a first-order diffraction occurs with respect to the wavelength of light generated in the active layer 23. Thus, the diffraction grating 26a is a first-order diffraction grating. The light generated in the active layer 23 is optically coupled to the diffraction grating 26 and is reflected by the diffraction grating 26a. The light reflected by the diffraction grating 26a is propagated within the second optical waveguide (direction parallel to the main surface 11a of the substrate 11). Furthermore, the reflected light is amplified in the active layer. Therefore, the diffraction grating 26a and the active layer 23 constitute a laser cavity.

The diffraction-grating layer 26 is, for example, an undoped GaInAsP layer. The diffraction-grating layer 26 preferably has a thickness of 200 nm or more, which is considerably larger than the thickness (about 10 nm) of the diffraction-grating layer of a conventional DFB semiconductor laser. For example, the diffraction-grating layer 26 has a thickness of 1 µm. The diffraction-grating layer 26 has a band gap wavelength of, for example, 1.25 µm. The diffraction-grating layer 26 has a smaller band gap energy than the upper cladding layer 25, which is disposed directly under the diffraction-grating layer 26. The diffraction-grating layer 26 has a higher refractive index than the upper cladding layer 25.

The buried layer 27 constitutes a portion of the diffraction grating 26a and fills and covers the periodic projections and recesses of the diffraction-grating layer 26. The buried layer 27 is, for example, a dielectric layer. This dielectric layer preferably contains at least one material selected from $SiO_2$, SiN, $Al_2O_3$, and TiO. The material of the buried layer 27 can be selected such that the difference in refractive indices between the buried layer 27 and the diffraction-grating layer 26 composed of a semiconductor is large. As described below, a relative refractive index difference (n1−n0)/n1 between the refractive index n1 of the diffraction-grating layer 26 and the refractive index n0 of the buried layer 27 is preferably 0.15 or more. Stated another way, the refractive index n0 of the buried layer 27 is preferably 85% or less of the refractive index n1 of the diffraction-grating layer 26. For example, the buried layer 27 is composed of $SiO_2$. In this case, the buried layer 27 has a refractive index of about 1.5, which is considerably lower than the refractive index of the diffraction-grating layer 26. The diffraction-grating layer 26 composed of a semiconductor typically has a refractive index of 3.3. In this case, the relative refractive index difference (n1−n0)/n1 is 0.55. The buried layer 27 has a thickness of, for example, 2 µm.

The buried layer 27 may be composed of a material having a refractive index that is different from the refractive index of the diffraction-grating layer 26. For example, the buried layer 27 is composed of a polyimide resin or a benzocyclobutene (BCB) resin. Polyimide resins and BCB resins are transparent with respect to the wavelength of light generated in the active layer 23 and do not cause large optical loss. Accordingly, these materials are preferably used for forming the buried layer 27. Polyimide resins and BCB resins have a refractive index of about 1.5, which is considerably lower than the refractive index of the diffraction-grating layer 26. Accordingly, the relative refractive index difference (n1−n0)/n1 can be readily made 0.15 or more.

Referring to FIG. 1, the buried parts 13a and 13b are disposed on regions of the main surface 11a except for a region where the mesa part 12 is disposed, such that the mesa part 12 is buried with the buried parts 13a and 13b disposed on the lateral surfaces of the mesa part 12. The buried part 13a includes a first semiconductor buried layer 131 and an n-type cap layer 132 disposed on the first semiconductor buried layer 131. The first semiconductor buried layer 131 is constituted by an n-type III-V group compound semiconductor layer. The buried part 13b includes a second semiconductor buried layer 133 and a p-type cap layer 134 disposed on the second semiconductor buried layer 133. The second semiconductor buried layer 133 is constituted by a p-type III-V group compound semiconductor layer. The first semiconductor buried layer 131 is constituted by a semiconductor layer of a conductivity type different from the conductivity type of the second semiconductor buried layer 133.

The first semiconductor buried layer 131 is composed of a semiconductor that has a lower refractive index and a higher band gap energy, compared with the lower optical confinement layer 22, the active layer 23, and the upper optical confinement layer 24. The first semiconductor buried layer 131 is composed of, for example, n-type InP. Similarly, the second semiconductor buried layer 133 is composed of a semiconductor that has a lower refractive index and a higher band gap energy, compared with the lower optical confinement layer 22, the active layer 23, and the upper optical confinement layer 24. The second semiconductor buried layer 133 is composed of, for example, p-type InP. The first semiconductor buried layer 131 and the second semiconductor buried layer 133 are in contact with the side surfaces of the lower cladding layer 21 to the diffraction-grating layer 26 in the mesa part 12 and the layers 21 to 26 are buried with the first semiconductor buried layer 131 and the second semiconductor buried layer 133. The n-type cap layer 132 is constituted by an n-type III-V group compound semiconductor layer having a higher concentration of a dopant than the first semiconductor buried layer 131. For example, the n-type cap layer 132 is an n-type InGaAsP layer. Similarly, the p-type cap layer 134 is constituted by a p-type III-V group compound semiconductor layer having a higher concentration of a dopant than the second semiconductor buried layer 133. For example, the p-type cap layer 134 is a p-type InGaAsP layer.

The cathode electrode 14 is disposed on the n-type cap layer 132 and is in ohmic contact with the n-type cap layer 132. The anode electrode 15 is disposed on the p-type cap layer 134 and is in ohmic contact with the p-type cap layer 134. The cathode electrode 14 and the anode electrode 15 supply a current to the active layer 23 in the mesa part 12. For example, the cathode electrode 14 contains AuGe. For example, the anode electrode 15 is constituted by Ti/Pt/Au.

Figure 3:
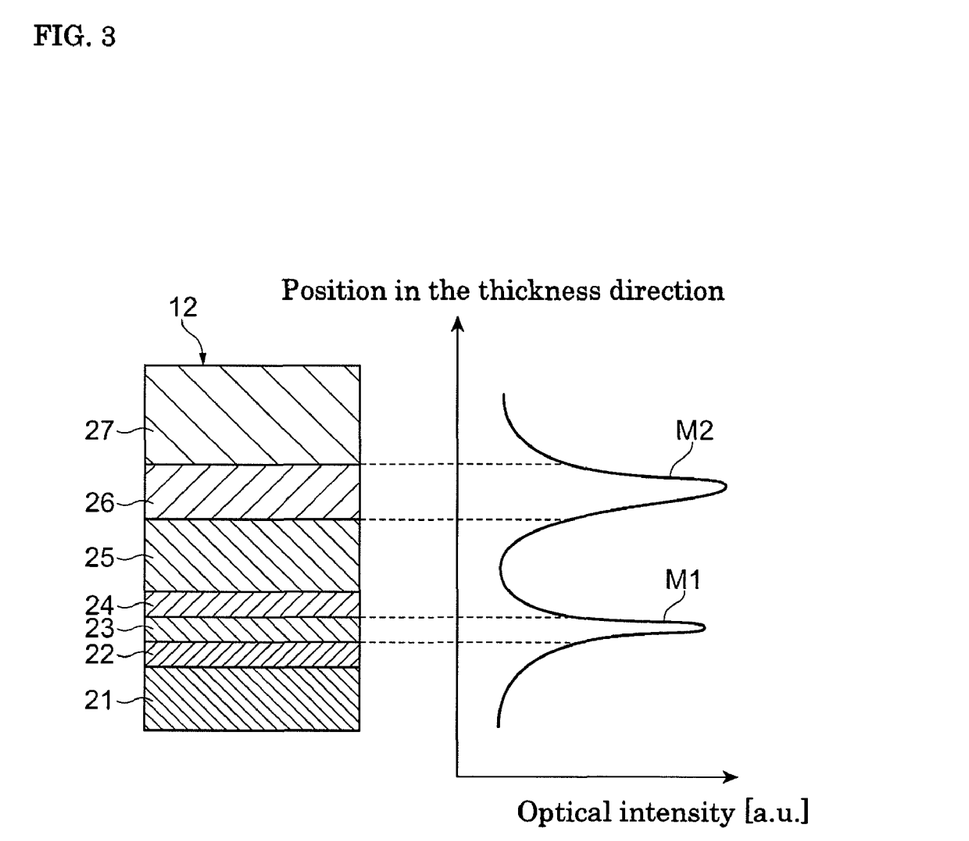
FIG. 3 illustrates guided modes formed in a semiconductor laser device.

Operations of the semiconductor laser device 10 having the above-described configuration will be described. FIG. 3 illustrates guided modes formed in the semiconductor laser device 10. In FIG. 3, the abscissa axis indicates the intensity of guided light and the ordinate axis indicates positions in the thickness direction of the mesa part 12. The multilayer structure of the mesa part 12 is also illustrated so as to correspond to the positions in the ordinate axis. As illustrated in FIG. 3, two guided modes are formed in the semiconductor laser device 10. One guided mode is an active-layer mode M1. The peak intensity of the active-layer mode M1 is distributed in the active layer 23 in the first optical waveguide. Another guided mode is a diffraction-grating-layer mode M2. The peak intensity of the diffraction-grating-layer mode M2 is distributed in the diffraction-grating layer 26 in the second optical waveguide. That is, the active-layer mode M1 mainly distributed in the active layer 23 and propagates in the first optical waveguide. The diffraction-grating-layer mode M2 mainly distributed in the diffraction-grating layer 26 and propagates in the second optical waveguide. The diffraction-grating-layer mode M2 is strongly coupled to the diffraction grating 26 because of large difference of refractive index between the diffraction-grating layer 26 and the buried layer 27 and large height of the projections (or large depth of the recesses) of the diffraction grating 26a. Therefore, the diffraction-grating-layer mode M2 has properties of a standing wave. The diffraction-grating-layer mode M2 is prominently formed in the cases where, as in the first embodiment, the diffraction-grating layer 26 is thick and the diffraction-grating layer 26 is separated from the active layer 23. The diffraction-grating layer 26 has a thickness of, for example, 200 nm or more. The active-layer mode M1 and the diffraction-grating-layer mode M2 propagate in parallel to each other within the semiconductor laser device 10. Furthermore, the active-layer mode M1 and the diffraction-grating-layer mode M2 are optically coupled to each other.

Figure 4:
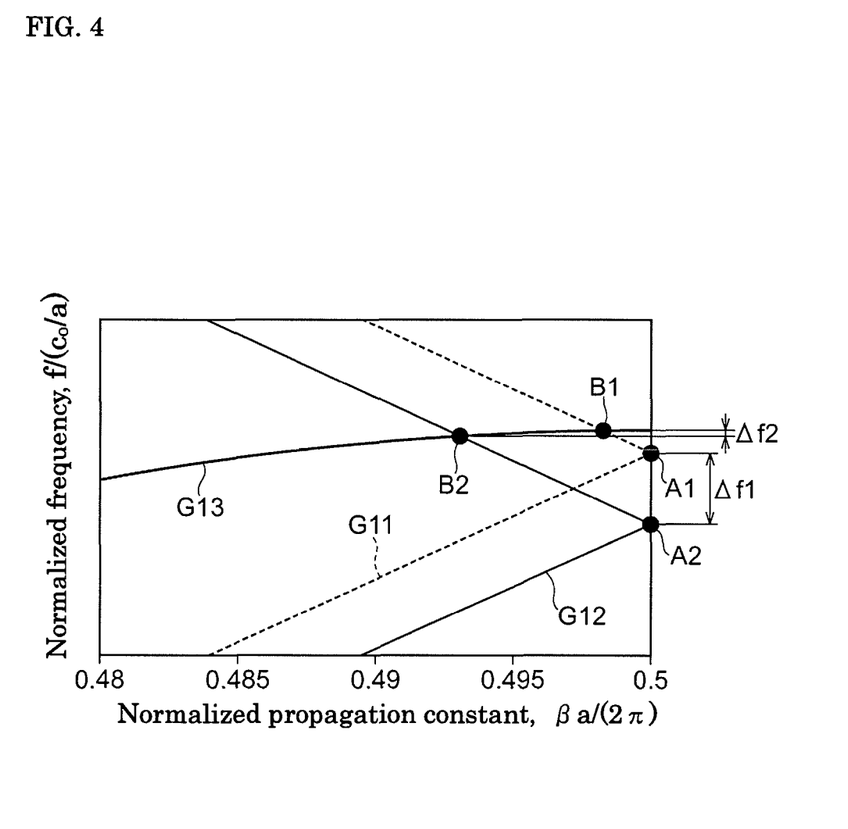
FIG. 4 is a graph illustrating the relationship between the frequency and the propagation constant of laser light generated in a semiconductor laser device.

FIG. 4 is a graph illustrating the relationship between the frequency and the propagation constant for the propagated light generated in the semiconductor laser device 10 when the semiconductor laser device 10 is modulated with a digital signal current constituted by a high level (level 1) and a low level (level 0). In FIG. 4, the ordinate axis indicates normalized frequency and the abscissa axis indicates normalized propagation constant. The frequency f of laser light and the wavelength $\lambda$, of laser light in vacuum have a relationship: $f=c_0/\lambda$. The normalized frequency is a parameter defined as $f/(c_0/a)$. The normalized propagation constant is a parameter defined as $\beta \cdot a/(2\pi)$. "a" represents the period of a diffraction grating. "$\beta$" represents a propagation constant. "$c_0$" represents the speed of light in vacuum. The normalized propagation constant is normalized such that, when the normalized propagation constant is 0.5, the frequency of laser light is Bragg frequency. A line G11 in FIG. 4 represents a dispersion curve of the active-layer mode M1 when the semiconductor laser device 10 is driven with a high-level signal current (that is, light transmitted from the semiconductor laser device 10 is on the high level). A line G12 in FIG. 4 represents a dispersion curve of the active-layer mode M1 when the semiconductor laser device 10 is driven with a low-level signal current (that is, light transmitted from the semiconductor laser device 10 is on the low level). A line G13 in FIG. 4 represents a dispersion curve of the diffraction-grating-layer mode M2. Since currents do not pass through the diffraction-grating layer 26 in the first embodiment, the dispersion curve of the diffraction-grating-layer mode M2 does not change whether transmitted light is on the high level or the low level.

In a conventional DFB laser in which only the active-layer mode is formed, lasing occurs at the Bragg frequency. This means that, in the dispersion curves of the active-layer modes in FIG. 4, the operating point of a conventional DFB laser is a point where the normalized propagation constant $\beta \cdot a/(2\pi)$ is 0.5. The Bragg frequency varies in accordance with variation in refractive index due to variation in an injection current when the DFB laser is modulated with high frequency signal. Specifically, when the high-level signal current is applied to the DFB laser, lasing occurs at a point A1 in FIG. 4. On the other hand, when the low-level signal current is applied to the DFB laser, lasing occurs at a point A2 in FIG. 4. In this case, the difference $\Delta$M1 between the normalized frequency at the point A1 and the normalized frequency at the point A2 appears as a considerable change in the lasing frequency or lasing wavelength (wavelength chirping).

In contrast, when the active-layer mode M1 and the diffraction-grating-layer mode M2 are coupled, lasing occurs at an operating point where phase matching conditions of the modes M1 and M2 coincide with each other. Specifically, when the high-level signal current is applied to the semiconductor laser device 10, lasing occurs at a point (point B1 in FIG. 4) of intersection of the line G11 and the line G13. On the other hand, when the low-level signal current is applied to the semiconductor laser device 10, lasing occurs at a point (point B2 in FIG. 4) of intersection of the line G12 and the line G13. Accordingly, the difference $\Delta$f2 between the normalized frequency at the point B1 and the normalized frequency at the point B2 appears as a change in the lasing frequency or the lasing wavelength.

Figure 5:
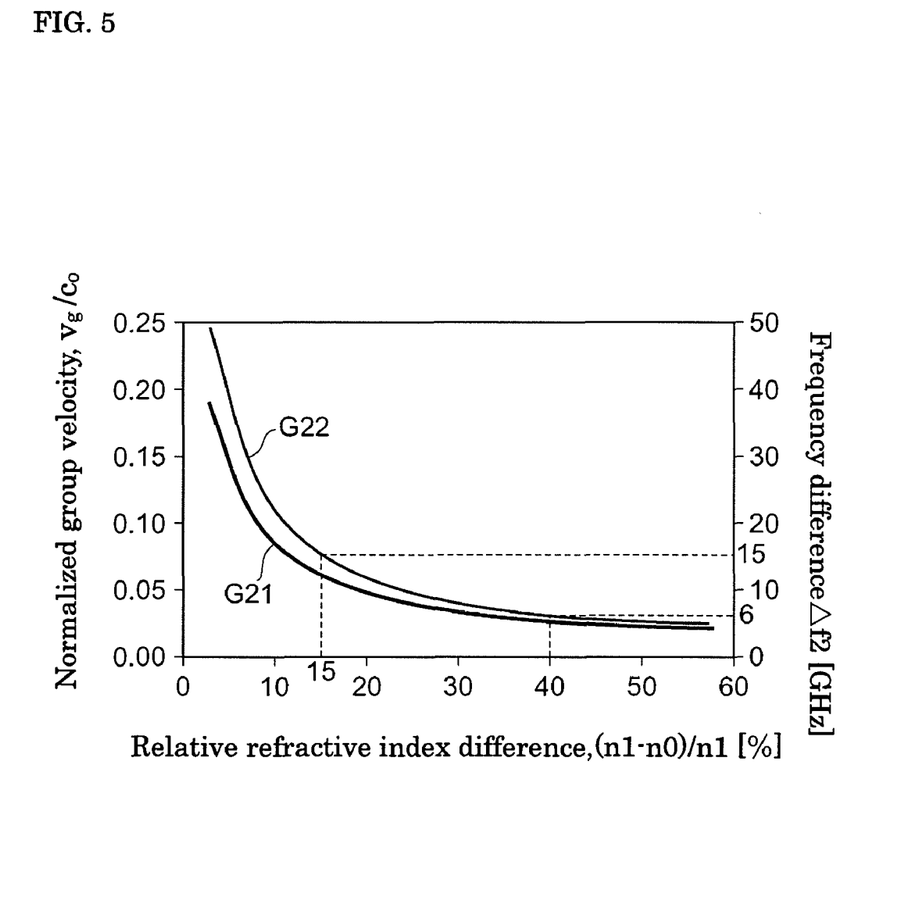
FIG. 5 illustrates the relationship between group velocity and a relative refractive index difference (n1−n0)/n1 between two materials constituting a diffraction grating where n1 represents a refractive index of one of the materials that has a higher refractive index and n0 represents a refractive index of the other of the materials that has a lower refractive index; and the relationship between the relative refractive index difference $(n1-n0)/n1$ and a frequency difference $\Delta f2$.

The smaller the gradient of the line G13 serving as the dispersion curve of the diffraction-grating-layer mode M2 is, the smaller the frequency difference $\Delta$M2 becomes. Stated another way, the smaller the group velocity $v_g$ of the diffraction-grating-layer mode M2 is, the smaller the frequency difference $\Delta$M2 becomes. Here, the group velocity $v_g$ is defined by $v_g=2\pi \cdot df/d\beta$. FIG. 5 illustrates the relationship (line G21) between the group velocity of the diffraction-grating-layer mode M2 and the relative refractive index difference between two materials constituting a diffraction grating. As for the two materials, the refractive index of one of the materials that has a higher refractive index is defined as n1 and the refractive index of the other material that has a lower refractive index is defined as n0. In this case, the relative refractive index difference between the two materials is represented by (n1−n0)/n1. FIG. 5 also illustrates the relationship (line G22) between the relative refractive index difference (n1−n0)/n1 and the frequency difference $\Delta$M2. In FIG. 5, the abscissa axis indicates the relative refractive index difference (n1−n0)/n1; the left ordinate axis indicates normalized group velocity ($v_g/c_0$) that has been normalized with the velocity $c_0$ of light in vacuum; and the right ordinate axis indicates the frequency difference $\Delta M2$. As for the frequency difference $\Delta f2$ in FIG. 5, actual frequency difference calculated from the normalized frequency difference $\Delta M2$ in FIG. 4 is plotted.

As illustrated in FIG. 5, the larger the refractive index difference between two materials constituting a diffraction grating becomes, the lower the group velocity becomes and the smaller the frequency difference $\Delta M2$ becomes. In general, the larger the coupling coefficient $\kappa$ between the guiding light and the diffraction grating is, the lower the group velocity of guiding light through the optical waveguide becomes. In the embodiment, the coupling coefficient ic of the diffraction grating 26a is increased by increasing the refractive index difference between two materials constituting a diffraction grating 26a. As a result, the group velocity of the diffraction-grating-layer mode M2 can be decreased and the frequency difference $\Delta M2$ can be decreased by increasing the refractive index difference between two materials constituting a diffraction grating 26a. In the semiconductor laser device 10 according to the first embodiment, to increase the refractive index difference between the two materials constituting the diffraction grating, the buried layer 27 composed of a dielectric material is used. The diffraction-grating layer 26 is constituted by a semiconductor layer having a large thickness of 200 nm or more and divided so as to have a period. Therefore, the diffraction grating 26a has projections with a large height or recesses with a large depth. This height of the projections or depth of the recesses in the diffraction grating 26a corresponds to the thickness of the diffraction-grating layer 26. The diffraction grating is constituted by the divided diffraction-grating layer 26 and the buried layer 27. The buried layer 27 is composed of a dielectric material. The buried layer 27 is formed on the periodic projections and recesses in the diffraction-grating layer 26 so as to fill the gaps in the diffraction-grating layer 26. Due to such a structure, the coupling coefficient $\kappa$ of the diffraction grating 26a is increased. The diffraction-grating layer 26 constituting a portion of the diffraction grating 26a is composed of a III-V group compound semiconductor. The buried layer 27 is composed of a dielectric material such as $SiO_2$. When the buried layer 27 is composed of $SiO_2$, it has a refractive index of about 1.5. When the diffraction-grating layer 26 is composed of GaInAsP, it has a refractive index of about 3.3. Accordingly, the coupling coefficient $\kappa$ of the diffraction grating 26a can be increased and hence the frequency difference $\Delta M2$ decreases. Therefore, wavelength chirping can be effectively suppressed.

FIG. 5 indicates that relative refractive index difference between two materials constituting a diffraction grating is preferably 0.15 or more to suppress the wavelength chirping. When the relative refractive index difference is 0.15 or more, the coupling coefficient $\kappa$ of the diffraction grating 26a becomes sufficiently high and the frequency difference $\Delta f2$ can be made 15 GHz or less. More preferably, the relative refractive index difference is 0.4 or more. In this case, the frequency difference $\Delta f2$ can be made 6 GHz or less. For example, in the first embodiment, when the diffraction-grating layer 26 is composed of a GaInAsP semiconductor and the buried layer 27 is composed of $SiO_2$, the relative refractive index difference is estimated at 0.55 and the frequency difference $\Delta f2$ can be sufficiently decreased. In a conventional DFB semiconductor laser device, the frequency difference $\Delta f1$, which represents wavelength chirping, is about 20 GHz.

A semiconductor laser device according to the present invention is not restricted to the above-described embodiment and other various modifications can be made. For example, in the first embodiment, a semiconductor laser device in which the active-layer and the like are composed of a III-V group compound semiconductors is described as an example. However, the present invention is also applicable to semiconductor laser devices containing other semiconductors. In addition, in the first embodiment, a semiconductor laser device in which a current is introduced through a side surface of the active layer is described as an example. However, the present invention is also applicable to semiconductor laser devices in which a current is introduced though a main surface of the active layer.

Principles of the present invention have been described on the basis of a preferred embodiment with reference to the drawings. However, those skilled in the art will understand that the embodiment can be changed in terms of details without departing from the principles. Therefore, all the modifications and changes within the scope and the spirit of Claims are claimed as the present invention.

What is claimed is:

1. A semiconductor laser device comprising:
   a lower cladding layer;
   an active layer disposed on the lower cladding layer;
   an upper cladding layer disposed on the active layer;
   a diffraction-grating layer disposed on the upper cladding layer, the diffraction-grating layer including periodic projections and recesses;
   a buried layer disposed on the periodic projections and recesses in the diffraction-grating layer;
   a mesa structure including the active layer, the mesa structure having a pair of lateral surfaces facing each other;
   a first semiconductor buried layer of a first conductivity type;
   a second semiconductor buried layer of a second conductivity type; and
   an electrode disposed on the first semiconductor buried layer and another electrode disposed on the second semiconductor buried layer;
   wherein the first semiconductor buried layer is disposed on one of the lateral surfaces of the mesa structure; and
   the second semiconductor buried layer is disposed on another one of the lateral surfaces of the mesa structure; and
   the mesa structure is buried with the first and second semiconductor buried layers,
   wherein the diffraction-grating layer and the buried layer constitute a diffraction grating, the lower cladding layer, the active layer, and the upper cladding layer constitute a first optical waveguide, the active layer constituting a first core region in the first optical waveguide, the upper cladding layer, the diffraction-grating layer, and the buried layer constitute a second optical waveguide, the diffraction-grating layer constituting a second core region in the second optical waveguide, the first optical waveguide and the second optical waveguide are optically coupled through the upper cladding layer and the buried layer is composed of a dielectric material.

2. The semiconductor laser device according to claim 1, further comprising: a lower optical confinement layer disposed between the lower cladding layer and the active layer; and an upper optical confinement layer disposed between the active layer and the upper cladding layer, wherein the lower optical confinement layer, the active layer, and the upper optical confinement layer constitute the first core region in the first optical waveguide.

3. The semiconductor laser device according to claim 1, wherein the dielectric material contains at least one of $SiO_2$, SiN, $Al_2O_3$, and TiO.

4. The semiconductor laser device according to claim 1, wherein the dielectric material is composed of a polyimide resin or a benzocyclobutene resin.

5. The semiconductor laser device according to claim 1, wherein a relative refractive index difference (n1−n0)/n1 is 0.15 or more where n1 represents a refractive index of the diffraction-grating layer and n0 represents a refractive index of the buried layer.

6. The semiconductor laser device according to claim 1, wherein the upper cladding layer has a thickness of 500 nm or more and 1500 nm or less.

7. The semiconductor laser device according to claim 1, wherein the diffraction-grating layer has a thickness of 200 nm or more.

8. The semiconductor laser device according to claim 1, wherein the diffraction grating is constituted by arranging the diffraction-grating layer and the buried layer alternately in a light propagation direction.

9. A semiconductor laser device comprising:
a lower cladding layer; an active layer disposed on the lower cladding layer; an upper cladding layer disposed on the active layer;
a diffraction-grating layer disposed on the upper cladding layer, the diffraction-grating layer including periodic projections and recesses; and
a buried layer disposed on the periodic projections and recesses in the diffraction-grating layer;
wherein the diffraction-grating layer and the buried layer constitute a diffraction grating, the lower cladding layer, the active layer, and the upper cladding layer constitute a first optical waveguide, the active layer constituting a first core region in the first optical waveguide, the upper cladding layer, the diffraction-grating layer, and the buried layer constitute a second optical waveguide, the diffraction-grating layer constituting a second core region in the second optical waveguide, the first optical waveguide and the second optical waveguide are optically coupled through the upper cladding layer, the buried layer is composed of a dielectric material and the diffraction grating is constituted by arranging the diffraction-grating layer and the buried layer alternately in a light propagation direction.

* * * * *